(12) United States Patent
Kagami

(10) Patent No.: US 6,972,165 B2
(45) Date of Patent: Dec. 6, 2005

(54) ELECTRON BEAM EXPOSURE MASK AND ELECTRON BEAM EXPOSURE METHOD USING THE SAME

(75) Inventor: Ichiro Kagami, Kanagawa (JP)

(73) Assignee: Sony Corporation, (JP)

( * ) Notice: Subject to any disclaimer, the term of this patent is extended or adjusted under 35 U.S.C. 154(b) by 49 days.

(21) Appl. No.: 10/343,228

(22) PCT Filed: May 30, 2002

(86) PCT No.: PCT/JP02/05269

§ 371 (c)(1),
(2), (4) Date: Jun. 16, 2003

(87) PCT Pub. No.: WO02/099856

PCT Pub. Date: Dec. 12, 2002

(65) Prior Publication Data

US 2004/0013949 A1    Jan. 22, 2004

(30) Foreign Application Priority Data

Jun. 5, 2001    (JP) ............................ 2001-169420

(51) Int. Cl.[7] .............................................. G03F 9/00
(52) U.S. Cl. ........................... 430/5; 430/296; 430/942
(58) Field of Search ............................ 430/5, 296, 942

(56) References Cited

U.S. PATENT DOCUMENTS 6,171,736 B1    1/2001    Hirayanagi ................ 430/22

FOREIGN PATENT DOCUMENTS

| JP | 57-97941 | 12/1955 |
|----|----------|---------|
| JP | 61-283121 | 12/1986 |

*Primary Examiner*—Christopher G. Young
(74) *Attorney, Agent, or Firm*—Rader, Fishman & Grauer, PLLC; Ronald P. Kananen

(57) ABSTRACT

An electron beam exposure mask which makes it possible to reduce the number of times of exchange and to shorten the exposure time, is disclosed. The electron beam exposure mask (10) comprises at least two each of one or at least two kinds of exposure regions, for example, three kinds of exposure regions consisting of hole layer exposure regions (A), wiring layer exposure regions (B), and gate layer exposure regions (C). By this, at the time of conducting exposure by use of each exposure region, it suffices to move the exposure region to a predetermined exposure position, and it is unnecessary to exchange the electron beam exposure mask (10) by taking it out of the electron beam exposure device. Further, since at least two each of each kind of exposure regions are provided, an exposure region stained during use can be substituted with another exposure region, so that the number of times of cleaning of the electron beam exposure mask (10) is reduced, and the number of times of exchange of the electron beam exposure mask (10) can be reduced. Therefore, the exposure time in a lithography step can be shortened.

6 Claims, 5 Drawing Sheets

ELECTRON BEAM EXPOSURE MASK AND ELECTRON BEAM EXPOSURE METHOD USING THE SAME

TECHNICAL FIELD

The present invention relates to an electron beam exposure mask, and particularly to an electron beam exposure mask provided with a plurality of exposure regions in each of which an exposure pattern to be transferred to a wafer is formed.

BACKGROUND ART

At present, in the lithography technology for forming a semiconductor pattern on a wafer, the main stream is the system in which reduction exposure of an original of design pattern called a photomask onto a wafer is conducted by use of light. The reduction ratio at the time of the reduction exposure is 1/5 or 1/4, and i rays (wavelength: 365 nm) and deep UV rays (wavelength: 248 nm, 193 nm) are used for the exposure. It is expected that an exposure wavelength of 157 nm will also be adopted for the exposure in the future. However, the size of semiconductor devices has been reduced at a speed higher than that of the advancement of such light lithography, and there is a request for putting a new lithography technology into practical use.

In recent years, as a lithography technology with a higher resolution, an electron beam projection exposure technology using an electron beam exposure device such as EPL (electron beam projection lithography) and LEEPL (low energy electron beam proximity projection lithography) has begun to be developed. The EPL is a technology in which an electron beam exposure mask which is four times as large as a design pattern is used, and exposure is conducted under a high acceleration voltage of 100 kV. In the LEEPL, on the other hand, the electron beam exposure mask is equal to the design pattern in size, and the acceleration voltage is as low as about 2 kV.

In such an electron beam projection exposure as these, a stencil mask in which an exposure pattern to be transferred onto a wafer is bored in an electron beam exposure mask substrate is used as the electron beam exposure mask.

FIGS. 4A to 4C are plan views showing examples of a transfer pattern and an electron beam exposure mask for forming the transfer pattern, in which FIG. 4A shows the transfer pattern, and FIGS. 4B and 4C show complementary masks.

In the case of transferring an annular pattern 100 as shown in FIG. 4A onto a wafer by the electron beam projection exposure, a stencil mask having an opening portion in the same shape as the annular pattern 100 cannot hold the central dot pattern 100a in the stencil mask. Therefore, it is necessary to split the stencil mask into two complementary masks 101 and 102 complementary to each other, as shown in FIGS. 4B and 4C, and to conduct exposure by use of the complementary masks 101 and 102, thereby forming the annular pattern 100 on the wafer.

Meanwhile, in the process of producing a semiconductor, there is the basic process of forming each layer for forming semiconductor devices, forming a resist pattern by lithography, and conducting etching. In the lithography step, hitherto, a single electron beam exposure mask has been provided only with an exposure region for forming a single layer in an individual step in production of a wafer; for example, an electron beam exposure mask for a device separation layer has been provided only with an exposure region in which an exposure pattern for forming the device separation layer is formed, or an electron beam exposure mask for a gate layer has been provided only with an exposure region in which an exposure pattern for forming the gate layer is formed.

FIG. 5 is a plan view showing an example of a conventional electron beam exposure mask to be used in the lithography step.

The electron beam exposure mask 200 is provided with exposure patterns 201a, 201b, 201c, 201d in an exposure region 201 thereof. The four exposure patterns 201a, 201b, 201c, 201d may be different in pattern shape, but, even in that case, all the exposure patterns are for forming the same layer.

Namely, in the related art, it has been necessary to exchange the electron beam exposure mask with an electron beam exposure mask provided with an exposure region in which exposure patterns for forming a layer are formed, each time of forming each layer in an individual step in the production of a wafer, in the lithography step.

However, in an electron beam exposure device at present, the exposure atmosphere is a vacuum, unlike the case of light exposure, and, therefore, exchange of the electron beam exposure mask takes much time.

The exposure time in the case of the electron beam exposure device includes electron beam irradiation time, electron beam conditioning time, alignment time, electron beam exposure mask transport time, wafer transport time, etc.; thus, the electron beam exposure device takes longer exposure time than in the case of the light exposure devices widely used hitherto, and the throughput is lower accordingly. Particularly, in the production of small amounts of many kinds of devices, the number of wafers to be exposed is small, and it is necessary to frequently exchange the electron beam exposure mask according to the formation of each layer. Therefore, the exposure time is prolonged by the exchange of the electron beam exposure mask, the position measurement after setting the electron beam exposure mask, and the like, which is a major cause of lowering of the throughput of the lithography step.

In the case of using complementary masks as the electron beam exposure mask, also, two electron beam exposure masks provided respectively with exposure patterns complementary to each other are used at the time of transferring an exposure pattern onto a wafer, so that the electron beam exposure mask must be exchanged for forming the complementary patterns, and the exposure time is prolonged accordingly.

In addition, unlike a photomask, the electron beam exposure mask cannot be used with a pellicle. Therefore, the useful life of the electron beam exposure mask may be shortened by adhesion thereto of dirt or foreign matter, so that the electron beam exposure mask must be frequently cleaned. In the case of cleaning the electron beam exposure mask, also, it is necessary to exchange the electron beam exposure mask, and the exposure time is prolonged accordingly.

The present invention has been made in consideration of the above-mentioned problems. Accordingly, it is an object of the present invention to provide an electron beam exposure mask which makes it possible to reduce the number of times of exchange thereof and to shorten the exposure time.

DISCLOSURE OF INVENTION

According to the present invention, there is provided an electron beam exposure mask comprising an exposure region in which an exposure pattern to be transferred onto a wafer is formed, wherein the electron beam exposure mask comprises at least two each of one or at least two kinds of exposure regions.

According to the above constitution, the electron beam exposure mask comprises at least two each of one or at least two kinds of exposure regions; therefore, at the time of exposure using each exposure region, it suffices to move the exposure region to a predetermined exposure position, and it is unnecessary to exchange the electron beam exposure mask by bringing the electron beam exposure mask to the outside of an electron beam exposure device. In addition, since the electron beam exposure mask comprises at least two exposure regions of one kind, when one of the exposure regions is stained, another of the exposure regions can be used in place of the stained exposure region, so that the number of times of cleaning of the electron beam exposure mask is reduced.

In addition, according to the present invention, there is provided an electron beam exposure mask comprising an exposure region in which an exposure pattern to be transferred onto a wafer is formed, wherein the electron beam exposure mask comprises one exposure region in which one exposure pattern is formed, and another exposure region in which another exposure pattern is formed.

According to the above constitution, the electron beam exposure mask comprises one exposure region and another exposure region. Therefore, different exposure patterns, for example, complementary patterns of which one exposure pattern and another exposure pattern are complementary to each other, can be exposed without taking the electron beam exposure mask out of the electron beam exposure device, so that the number of times of exchange of the electron beam exposure mask is reduced.

BRIEF DESCRIPTION OF DRAWINGS

FIGS. 4A to 4C are plan views showing examples of a transfer pattern and an electron beam exposure mask for forming the transfer pattern, in which FIG. 4A shows the transfer pattern, and FIGS. 4B and 4C show complementary masks.

BEST MODE FOR CARRYING OUT THE INVENTION

Figure 1:
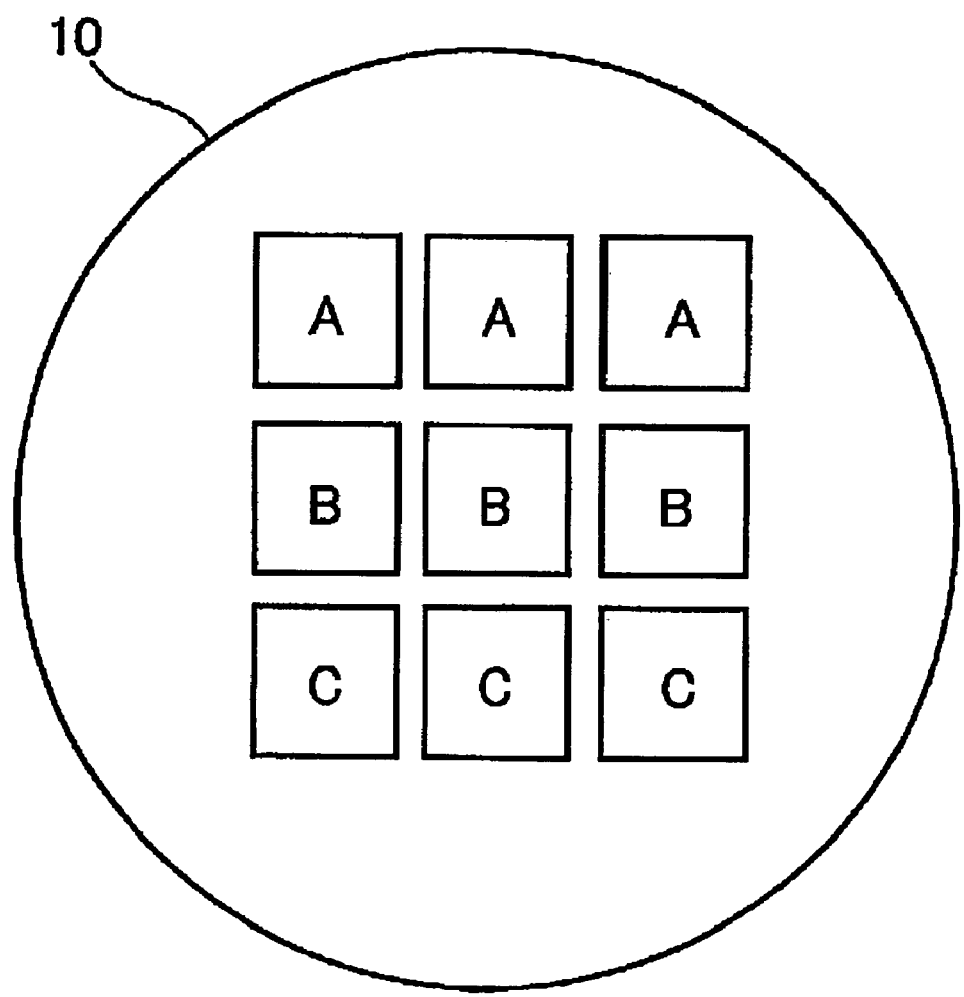
FIG. 1 is a plan view of an electron beam exposure mask according to a first mode for carrying out the present invention.

Now, a mode for carrying out the present invention will be described referring to the drawings.

FIG. 1 is a plan view of an electron beam exposure mask according to a first mode for carrying out the present invention.

The electron beam exposure mask 10 is provided with exposure regions in which exposure patterns to be transferred onto a wafer are formed respectively, for example, three kinds of exposure regions consisting of a hole layer exposure region A as an exposure region in which an exposure pattern to be transferred to a hole layer in the process of producing a semiconductor is formed, a wiring layer exposure region B as an exposure region in which an exposure pattern to be transferred to a wiring layer is formed, and a gate layer exposure region C as an exposure region in which an exposure pattern to be transferred to a gate layer is formed. Three each of these exposure regions are provided in a single sheet of the electron beam exposure mask 10, namely, a total of nine exposure regions are provided in the single sheet of the electron beam exposure mask 10.

In the case of electron beam exposure by use of the electron beam exposure mask 10 constituted as above, normally, the three exposure regions consisting of the hole layer exposure region A, the wiring layer exposure region B and the gate layer exposure region C are used. The remaining two each of the exposure regions are used as spare masks with which an exposure region stained during use is exchanged.

Here, a case in which ten wafers to be exposed are used, and the exposure pattern to be transferred to the hole layer is exposed onto the first to third wafers, the exposure pattern to be transferred to the wiring layer is exposed onto the fourth to sixth wafers, and the exposure pattern to be transferred to the gate layer is exposed onto the seventh to tenth wafers, will be described.

In this case, according to the electron beam exposure mask 10 according to the present mode, exposure onto the wafer can be continuously conducted without exchanging the electron beam exposure mask 10, as contrasted to the related art method in which mask exchange is conducted at a time point after exposure onto the hole layer and before exposure onto the wiring layer and at a time point after exposure onto the wiring layer and before exposure onto the gate layer. In the case of using the electron beam exposure mask 10 according to the present mode, first, exposure onto the first to third wafers of the ten wafers to be exposed is conducted by use of the hole layer exposure region A. Next, a mask stage with the electron beam exposure mask 10 fixed thereon is moved to change the positions of the hole layer exposure region A and the wiring layer exposure region B, and exposure onto the fourth to sixth wafers is conducted by use of the wiring layer exposure region B. As for the gate layer exposure region C, also, the mask stage with the electron beam exposure mask 10 fixed thereon is moved to change the positions of the wiring layer exposure region B and the gate layer exposure region C, and exposure onto the seventh to tenth wafers is conducted by use of the gate layer exposure region C.

Thus, according to the electron beam exposure mask 10 according to the present mode, in the case of conducting exposure onto a plurality of kinds of layers, only the wafers are exchanged, and the electron beam exposure mask need not be exchanged by taking it out of the electron beam exposure device, though each of the exposure regions is moved according to the exposure onto each of the layers. Therefore, it is possible to shorten the exposure time.

The hole layer, the wiring layer, and the gate layer used in the above description are mere examples; as the exposure regions formed in the electron beam exposure mask 10, naturally, exposure regions in which exposure patterns for other layers than the just-mentioned layers are formed may be adopted. In addition, the exposure pattern of the exposure regions formed in the electron beam exposure mask 10 may be of a plurality of kinds, such as the kinds for the hole layer, for the wiring layer, and for the gate layer, and may be of a single kind, such as the kind for only the hole layer or for only the wiring layer. Furthermore, while the number of the spare masks are two in the above description, the number is not limited to this.

Figure 2:
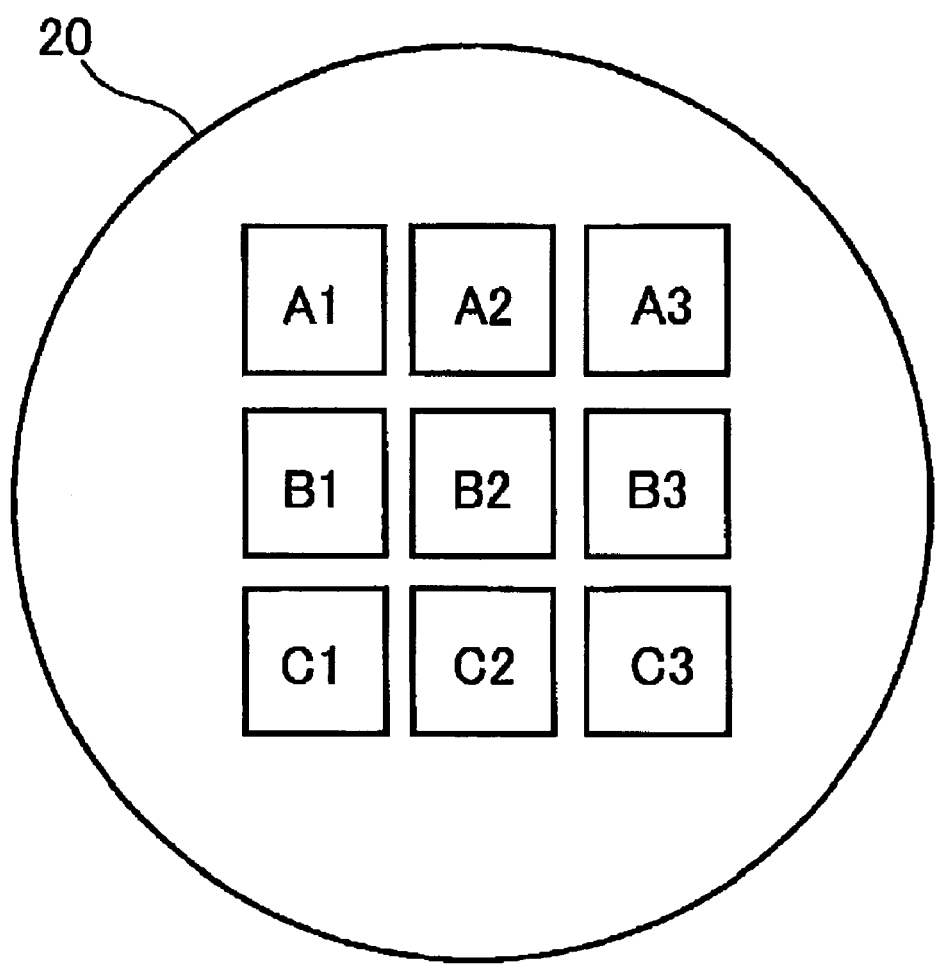
FIG. 2 is a plan view of an electron beam exposure mask according to a second mode for carrying out the present invention.

FIG. 2 is a plan view of an electron beam exposure mask according to a second mode for carrying out the present invention.

The electron beam exposure mask 20 is provided with exposure regions in which exposure patterns to be transferred onto a wafer are formed, for example, a total of nine exposure regions consisting of hole layer exposure regions A1, A2, A3 as exposure regions in which an exposure pattern to be transferred to a hole layer in the process of producing a semiconductor is formed, wiring layer exposure regions B1, B2, B3 as exposure regions in which an exposure pattern to be transferred to a wiring layer is formed, and gate layer exposure regions C1, C2, C3 as exposure regions in which an exposure pattern to be transferred to a wiring layer is formed. Here, same-shape exposure patterns which are exposure patterns of the same shape are formed in the hole layer exposure regions A1, A2, A3. Similarly, same-shape exposure patterns are formed in the wiring layer exposure regions B1, B2, B3, and same-shape exposure patterns are formed in the gate layer exposure regions C1, C2, C3.

Electron beam exposure by use of the electron beam exposure mask 20 constituted as above will be described by taking as an example the case of forming a transfer pattern by double exposure.

First, in the case of exposing an exposure pattern to be transferred to the hole layer, exposure is conducted with an exposure amount of ½ of a total exposure amount necessary for forming the transfer pattern, by use of the hole layer exposure region A1. Next, a mask stage with the electron beam exposure mask 20 fixed thereon is moved to move the hole layer exposure region A2 to the exposure position for the hole layer at which the hole layer exposure region A1 has been disposed. By use of the hole layer exposure region A2, exposure is conducted with an exposure amount of ½ of the total exposure amount necessary for forming the transfer pattern.

Subsequently, in the case of exposing an exposure pattern to be transferred to the wiring layer, exposure is conducted with an exposure amount of ½ of a total exposure amount necessary for forming the transfer pattern, by use of the wiring layer exposure region B1. Then, the mask stage is moved, and exposure is conducted with an exposure amount of ½ of the total exposure amount necessary for forming the transfer pattern, by use of the wiring layer exposure region B2.

Also in the case of exposing an exposure pattern to be transferred to the gate layer, similarly, exposure is conducted with an exposure amount of ½ of a total exposure amount necessary for forming the transfer pattern, by use of the gate layer exposure region C1, then the mask stage is moved, and exposure is conducted with an exposure amount of ½ of the total exposure amount necessary for forming the transfer pattern, by use of the gate layer exposure region C2.

In the case of double exposure as just-mentioned, the hole layer exposure region A3, the wiring layer exposure region B3, and the gate layer exposure region C3 are used as spare masks with which an exposure region stained during use is to be exchanged.

Besides, in the case of triple exposure by use of the electron beam exposure mask 20 according to the present mode, exposure using each of the hole layer exposure regions A1, A2, A3 is conducted with an exposure amount of ⅓ of a total exposure amount necessary for forming the transfer pattern. Also as for the wiring layer exposure regions B1, B2, B3 and the gate layer exposure regions C1, C2, C3, similarly, exposure with an exposure amount of ⅓ of the total exposure amount is conducted.

Thus, multiple exposure of a transfer pattern is conducted by use of different exposure regions of the same-shape exposure patterns, for example, the hole layer exposure regions A1, A2, A3 formed in the electron beam exposure mask 20. Therefore, it is unnecessary to exchange the electron beam exposure mask 20 by taking it out of the electron beam exposure device, and the exposure time can be shortened. Further, there is rarely the case where the same-shape exposure patterns have defects at the same position, so that defect transfer property can be reduced by the multiple exposure using the different exposure regions.

The hole layer, the wiring layer, and the gate layer used in the above description are mere examples; as the exposure regions formed in the electron beam exposure mask 20, naturally, exposure regions in which exposure patterns for other layers than the just-mentioned layers are formed may be adopted. In addition, the exposure pattern of the exposure regions formed in the electron beam exposure mask 20 may be of a plurality of kinds, such as the kinds for the hole layer, for the wiring layer, and for the gate layer, and may be of a single kind, such as the kind for only the hole layer or for only the wiring layer. Further, while the exposure regions are formed by setting the number of times of exposure to be two or three in the above description, the number of times of exposure and the number of exposure regions formed are not limited to these values.

Figure 3:
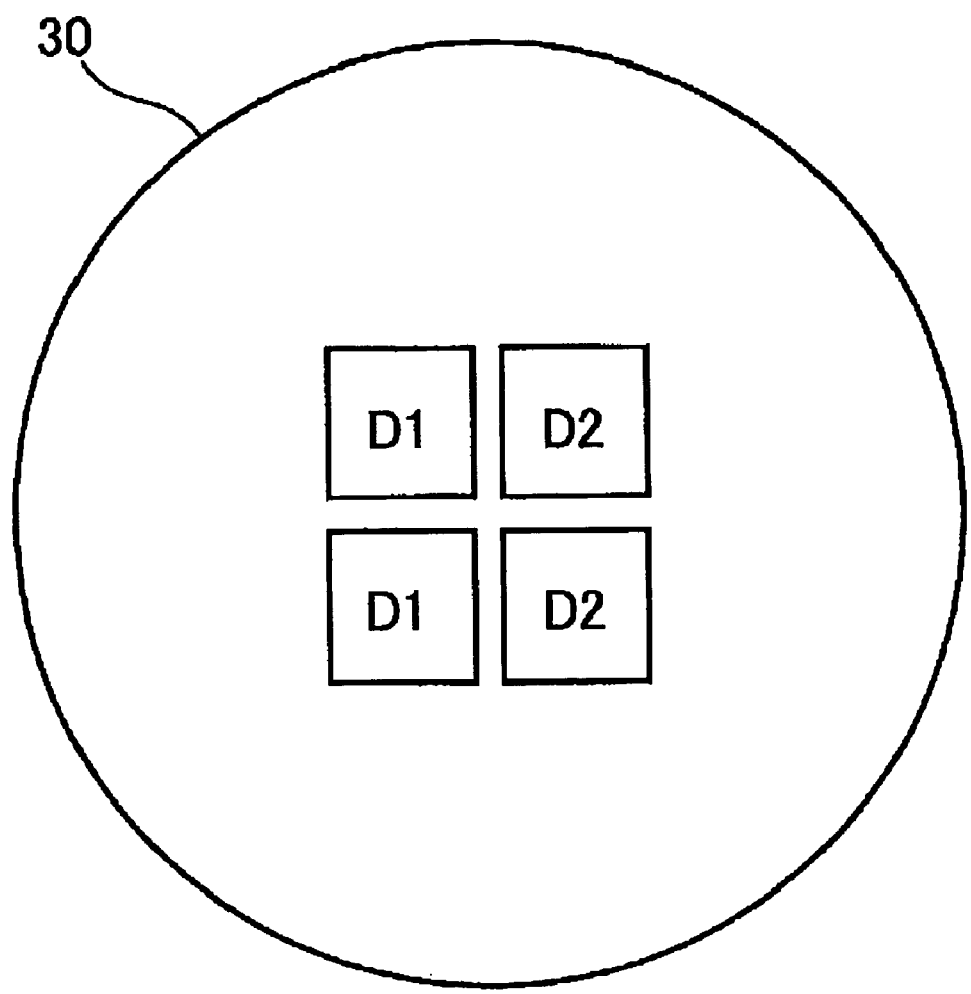
FIG. 3 is a plan view of an electron beam exposure mask according to a third mode for carrying out the present invention.
Figure 4A:
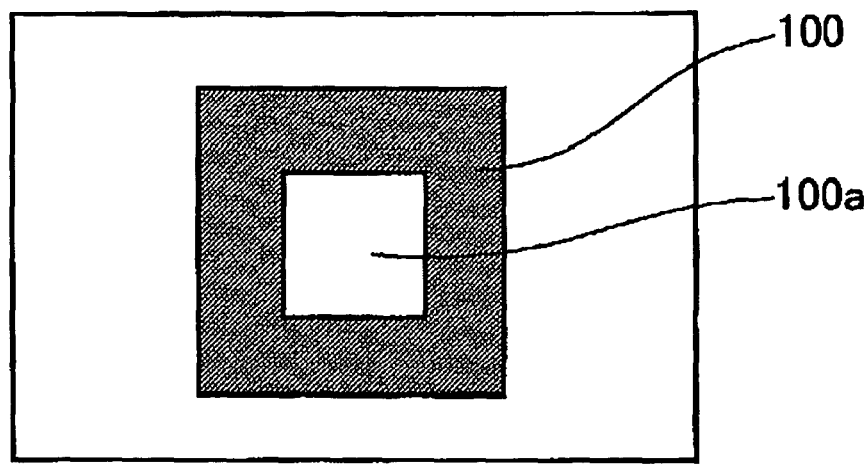
Figure 4B:
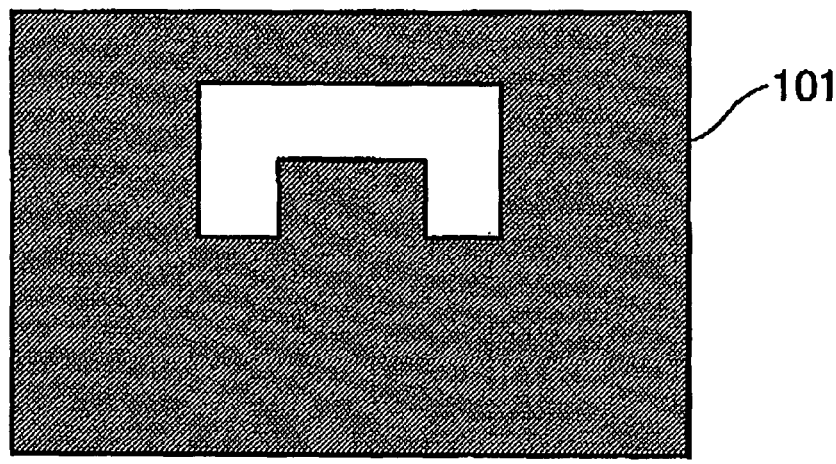
Figure 4C:
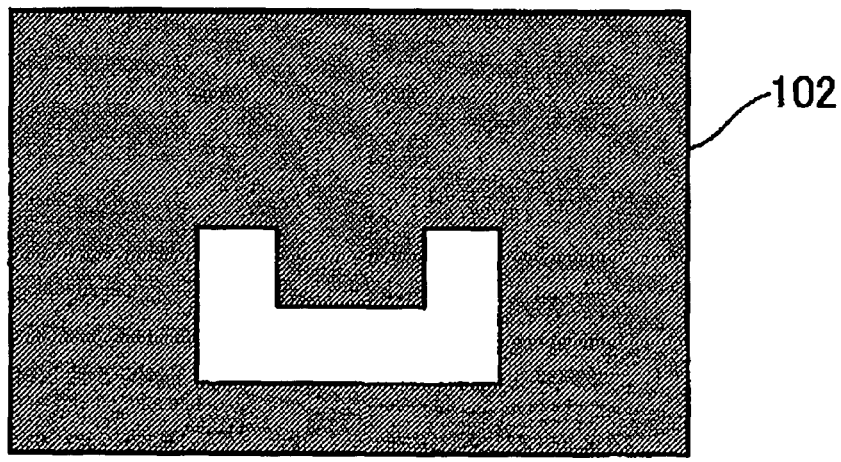
Figure 5:
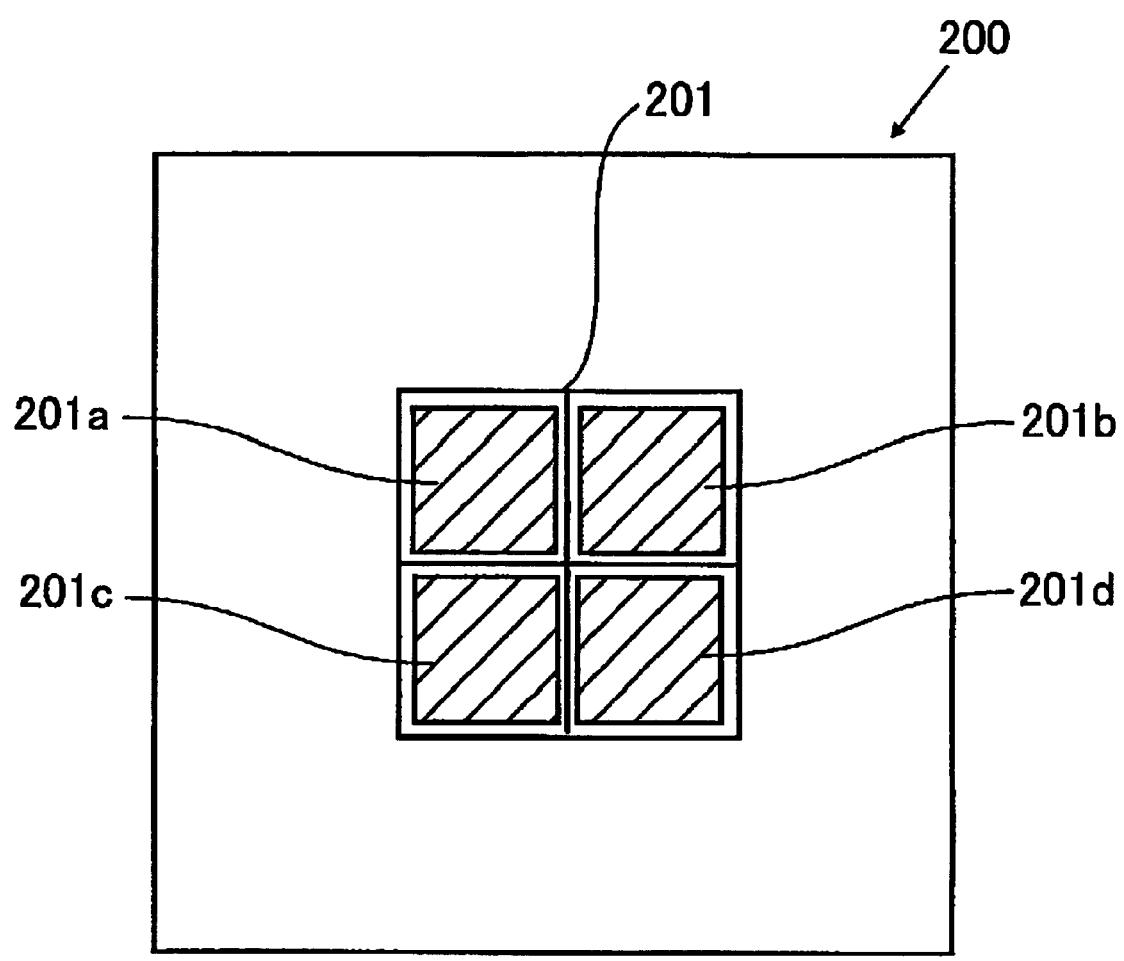
FIG. 5 is a plan view showing an example of a conventional electron beam exposure mask to be used in a lithography step.

FIG. 3 is a plan view of an electron beam exposure mask according to a third mode for carrying out the present invention.

The electron beam exposure mask 30 is provided with two each of exposure regions D1, D2 in which exposure patterns to be transferred onto a wafer are formed respectively. The exposure pattern in the exposure region D1 and the exposure pattern in the exposure region D2 are complementary patterns which are complementary to each other, and a desired transfer pattern can be obtained by exposure by use of both of the exposure regions D1, D2.

In the case of conducting electron beam exposure by use of such an electron beam exposure mask 30 as this, first, exposure is conducted by use of the exposure region D1, then a mask stage with the electron beam exposure mask 30 fixed thereon is moved to change the positions of the exposure region D1 and the exposure region D2, and exposure is conducted by use of the exposure region D2.

Thus, since the exposure regions D1, D2 in which the exposure patterns complementary to each other are formed are formed in the single sheet of electron beam exposure mask 30, the complementary patterns can be formed without exchanging the electron beam exposure mask 30 with another one by taking it out of the electron beam exposure device at the time of exposure, and the exposure time can be shortened.

While two each of the exposure regions D1, D2 are provided, one set of the exposure regions D1, D2 are normally used for exposure, and the remaining two exposure regions D1, D2 can be used as spare masks for exchange upon staining of the one set of exposure regions D1, D2 being used.

In addition, since two each of the exposure regions D1, D2 are provided, defect transfer property can be reduced by conducting multiple exposure with an exposure amount of ½ of a total exposure amount necessary for forming a transfer pattern, by use of the exposure regions D1, D2, respectively.

While the case where two each of the exposure regions D1, D2 are formed in the electron beam exposure mask 30 has been described above, exposure regions in which other complementary patterns different in shape from the exposure regions D1, D2 are formed may be formed in the electron beam exposure mask 30 in addition to the exposure regions D1, D2. Besides, while the electron beam exposure mask 30 described above is provided with a total of four exposure regions, the number of exposure regions formed is not limited to this.

Furthermore, while the exposure patterns complementary to each other are formed respectively in the exposure regions D1, D2 in the above description, exposure patterns to be transferred to layers such as, for example, a hole layer, a wiring layer, and a gate layer, may be formed in the exposure regions D1, D2.

In the above description, in the case of conducting the exposure as equal-size exposure, the exposure patterns in the exposure regions formed in the electron beam exposure mask are the same in size with the transfer patterns formed on the wafer, so that a larger number of exposure regions can be formed in the electron beam exposure mask, as compared with the case of ¼-fold exposure or ⅕-fold exposure, whereby the effect of shortening the exposure time is enhanced.

As has been described above, according to the present invention, at least two each of one or at least two kinds of exposure regions are formed in a single sheet of electron beam exposure mask. By this, it is possible to reduce the number of times of exchange of the electron beam exposure mask and to shorten the exposure time, in a lithography step.

In addition, where exposure patterns complementary to each other are formed in a single sheet of electron beam exposure mask, complementary patterns can be formed without taking the electron beam exposure mask out of the electron beam exposure device, and the exposure time can be shortened.

By use of different exposure regions formed in a single sheet of electron beam exposure mask, it is possible to perform multiple exposure without taking the electron beam exposure mask out of the electron beam exposure device, to reduce the number of times of exchange of the electron beam exposure mask, and to reduce defects in the transferred pattern.

Furthermore, since the number of times of cleaning of the electron beam exposure mask is reduced, the number of times of exchange of the electron beam mask is reduced, and the time for the exchange can be omitted.

With the electron beam exposure mask as described above, it is possible to reduce the number of sheets of the electron beam exposure masks used for exposure, and to contrive a reduction in cost and a reduction in the storage area for the electron beam exposure masks.

What is claimed is:

1. An electron beam exposure mask comprising:
   a plurality of exposure regions each having an exposure pattern, wherein each exposure pattern is to be transferred onto one of a plurality of multi-layer wafers,
   wherein each of a plurality of first exposure regions of the plurality of exposure regions transfers a first exposure pattern to a first layer of each multi-layer wafer and each of a plurality of second exposure regions of the plurality of exposure regions transfers a second exposure pattern to a second layer of each multi-layer wafer.

2. An electron beam exposure mask comprising:
   a plurality of exposure regions each having an exposure pattern to be transferred onto one of a plurality of multi-layer wafers,
   wherein a first exposure region of the plurality of exposure regions transfers a first exposure pattern to a first layer of each multi-layer wafer and a second exposure region of the plurality of exposure regions transfers a second exposure pattern to a second layer of each multi-layer wafer.

3. The electron beam exposure mask as set forth in claim 2, wherein said first exposure pattern and said second exposure pattern are complementary patterns.

4. An electron beam exposure method by use of an electron beam exposure mask that includes a first exposure region and a second exposure region in which a plurality of exposure patterns to be transferred onto a plurality of multi-layer wafers is formed, said method comprising the steps of:
   transferring a first pattern to a first layer of a first group of the plurality of multi-layer wafers by using the first exposure region of the exposure mask; and
   transferring a second pattern to a second layer of a second group of the plurality of multi-layer wafers using the second exposure region of the exposure mask.

5. The electron beam exposure method as set forth in claim 4, further comprising the steps of:
   exposing the first layer of the first group of the plurality of multi-layer wafers by using a third exposure region having a third exposure pattern that is of a same shape as the first exposure pattern of said first exposure region; and
   exposing the second layer of the second group of the plurality of multi-layer wafer using a fourth exposure region having a fourth exposure pattern that is of a same shape as the second exposure pattern of said second exposure region.

6. The electron beam exposure method as set forth in claim 4, wherein said first exposure pattern and said second exposure pattern are complementary patterns.

* * * * *